United States Patent
Cader et al.

(10) Patent No.: US 7,042,726 B2
(45) Date of Patent: May 9, 2006

(54) LOW MOMENTUM LOSS FLUID MANIFOLD SYSTEM

(75) Inventors: Tahir Cader, Liberty Lake, WA (US); Robert J. Ressa, Spokane, WA (US)

(73) Assignee: Isothermal Systems Research, Inc., Liberty Lake, WA (US)

( * ) Notice: Subject to any disclaimer, the term of this patent is extended or adjusted under 35 U.S.C. 154(b) by 0 days.

(21) Appl. No.: 11/115,601

(22) Filed: Apr. 27, 2005

(65) Prior Publication Data

US 2005/0195570 A1    Sep. 8, 2005

Related U.S. Application Data

(63) Continuation of application No. 10/769,259, filed on Jan. 30, 2004, now Pat. No. 6,958,911.

(51) Int. Cl.
*H05K 7/20* (2006.01)

(52) U.S. Cl. .............. 361/699; 361/689; 361/700; 174/15.1; 165/80.4

(58) Field of Classification Search ........ 361/687–689, 361/699; 174/15.1; 165/80.4, 104.33; 62/259.2
See application file for complete search history.

(56) References Cited

U.S. PATENT DOCUMENTS

| | | | | |
|---|---|---|---|---|
| 5,365,749 A | * | 11/1994 | Porter | 62/259.2 |
| 5,823,005 A | * | 10/1998 | Alexander et al. | 62/259.2 |
| 6,404,640 B1 | * | 6/2002 | Ishimine et al. | 361/720 |

* cited by examiner

*Primary Examiner*—Boris Chervinsky
(74) *Attorney, Agent, or Firm*—Paul A. Knight

(57) ABSTRACT

The present invention is a liquid cooling system that cools a plurality of electronic components connected in parallel. A pump delivers a cooling fluid, as a liquid, to a supply manifold wherein it splits into distinct branch lines. Preferably, the branch lines feed coolant to individual spray modules. The liquid coolant removes heat from the components to be cooled. The resulting fluid mixture exits the spray modules via a plurality of return branches. Each individual return branch feeds into a return manifold at an acute angle. The angular transitions between the return branches and the return manifold provides low manifold losses and a more efficient system.

28 Claims, 4 Drawing Sheets

LOW MOMENTUM LOSS FLUID MANIFOLD SYSTEM

CROSS REFERENCE TO RELATED APPLICATIONS

This application is a continuation of U.S. patent application Ser. No. 10,769,259 entitled Low Momentum Loss Fluid Manifold System filed Jan. 30, 2004 now U.S. Pat. No. 6,958,911.

STATEMENT REGARDING FEDERALLY SPONSORED RESEARCH OR DEVELOPMENT

Not related to this application.

BACKGROUND

1. Field of the Invention

The present invention relates generally to liquid cooling thermal management systems and more specifically it relates to a liquid cooling management system that provides economies of scale with consistent high performance through the use of a low momentum loss fluid manifold system.

2. Description of the Related Art

Liquid cooling is well known in the art of cooling electronics. As air cooling heat sinks continue to be pushed to new performance levels, so has their cost, complexity, and weight. Liquid cooling systems provide advantages over air cooling systems in terms of heat removal rates, component reliability and package size.

Liquid cooling systems are comprised of many different species. Although each specie may have unique advantages and disadvantages, they are all designed to perform the same goal: remove heat from an electronic component. Generally, liquid coolant is placed in thermal contact with a component to be cooled wherein energy is transferred from the higher temperature component to the coolant. A pump circulates the liquid through the closed system, thus allowing the cooling fluid to continuously transfer thermal energy from the component to be cooled and to a desired location. Typically, the absorbed heat is removed from the cooling fluid through the use of a heat exchanger. Species of liquid cooling systems can be lumped into two categories: single-phase and two-phase. The "phase" signifies how the cooling fluid absorbs and exchanges energy.

Single-phase liquid cooling utilizes a pure liquid for absorbing heat from the component to be cooled. Energy is absorbed by the coolant through sensible heat gains. The temperature of the coolant increases as energy is absorbed according to well known engineering formulas. An example of a single-phase liquid cooling system is described by U.S. Pat. No. 6,234,240. Due to the simple nature of single-phase fluid flow and sensible heat gains, single-phase liquid cooling solutions are fairly straight-forward to design and implement.

The preferred method of liquid cooling is two-phase. A two-phase system absorbs energy from the component to be cooled by means of latent heat gains of its fluid. The temperature of the coolant does not necessarily change, but rather part of the coolant is vaporized as energy is absorbed. The vaporized coolant is then transferred to a heat exchanger, or condenser, where energy is removed from the vapor causing it to transform back to a liquid state. An exemplary two-phase cooling solution is described by U.S. Pat. No. 5,220,804, which describes how atomization of the cooling fluid, along with vapor management within the spray module, provides high heat flux thin film evaporative cooling.

The advantages of two-phase cooling over single-phase cooling are significant. Due to the amount of energy needed to vaporize a liquid in comparison to the energy required to raise its temperature, two-phase systems provide the ability to have more compact components, require less input energy and provide higher heat removal performance than single-phase systems.

Although both single-phase and two-phase liquid cooling solutions provide many advantages over air cooling solutions, they also have drawbacks. One such drawback is that liquid cooling can be more expensive than air cooling. In the case of a single processor application, an air cooling heat sink may be comprised of an aluminum extrusion and a fan. In the case of liquid cooling, for each processor, a pump, a heat exchanger, tubing, fittings, fluid and a thermal management unit are needed. Although the performance of liquid cooling may justify the increased cost over air cooling, liquid cooling a single processor may require a cost premium.

One of the ways to reduce costs of liquid cooling solutions is to cool multiple electronic components from a single closed loop liquid cooling system. In the case of a rack full of servers, many computer systems may be chained together. The result is a significant savings through economies of scale. Chaining electronic components together can be accomplished in two ways: parallel and series connections.

With series connections, the fluid is routed from one heat generating component to another, until all units have been cooled. Although this method is largely used with single phase systems, it can also be used with two-phase systems. A significant problem with series connections is that the cooling fluid is at a different thermal state at each electronic component along the chain. As one processor may go from a max power consumption state to an idle state, that processor may create a thermal cycle for the other processors in the system. Thermal cycling reduces component reliability.

With parallel connections, the fluid is routed from the pump directly to all components to be cooled. The fluid is also removed from the thermal management units via individual parallel branches. A prior art return system is shown in FIG. 2 of the attached drawings wherein each thermal management unit has a unique fluid path. Although this type of connection is used primarily with two-phase systems, it can be used with single-phase systems as well. Parallel connections remedy the disadvantages of series connections, but it too creates challenges.

A first challenge with parallel connections using two-phase flow is that the flow of fluid can be complicated. Vapor is significantly less dense than liquid and thus the mixture can create multiple flow patterns including: annular, slug and froth. The mode of flow can be difficult to predict and tests have shown the mode of flow to have a significant impact on the performance of a cooling system.

Another problem with parallel connections is that the numerous transitions can cause system back-pressures. Back-pressures, or restrictions downstream of a spray module, can cause an increased pressure level within a spray module. Increased spray module pressures decrease vaporization and overall heat transfer rates. In addition, back-pressures create system inefficiencies as the pump must perform additional work.

Yet another problem with parallel connections is that in many computer cooling applications, the locations of particular processors may not be fixed. The parallel connections of the cooling system must be created in a fashion that provides configuration flexibility.

Thus, there is a need for a two-phase parallel liquid cooling solution capable of cooling many electronic components in non-specific configurations. It is highly desirable for such a system to provide consistent cooling performance under a wide range of conditions.

BRIEF SUMMARY OF THE INVENTION

In order to solve the problems of the prior art, and to provide a liquid cooling solution that allows multiple components to be cooled in parallel, a low momentum loss fluid manifold system has been developed.

The present invention is a liquid cooling system that cools a plurality of electronic components connected in parallel. A pump delivers a cooling fluid, as a liquid, to a supply manifold wherein it splits into distinct branch lines. Preferably, the branch lines feed coolant to individual spray modules. The liquid coolant removes heat from the components to be cooled. The resulting fluid exits the spray modules via return branches. Each individual return branch feeds into a return manifold at an acute angle. The acute angular transitions between the return branches and the return manifold provides low momentum losses and a more efficient system. In addition, the conservation of return fluid momentum in each of the return branches helps draw fluid from other return branches in the system.

These and other features, aspects, and advantages of the present invention will become better understood with regard to the following description, and accompanying drawings

BRIEF DESCRIPTION OF THE DRAWINGS

In the course of the detailed description to follow, reference will be made to the attached drawings. These drawings show different aspects of the present invention and, where appropriate, reference numerals illustrating like structures, components, and/or elements in different figures are labeled similarly. It is understood that various combinations of the structures, components, and/or elements other than those specifically shown are contemplated and within the scope of the present invention.

DETAILED DESCRIPTION OF THE PREFERRED EMBODIMENTS

Many of the fastening, connection, manufacturing and other means and components utilized in this invention are widely known and used in the field of the invention are described, and their exact nature or type is not necessary for a person of ordinary skill in the art or science to understand the invention; therefore they will not be discussed in detail.

Applicant hereby incorporates by reference U.S. Pat. No. 5,220,804 for a high heat flux evaporative cooling system. Although spray cooling is herein described as the preferred method of two-phase cooling, the present invention is not limited to such a system. Spray cooling is only discussed in detail to provide a known preferred embodiment.

Figure 1:
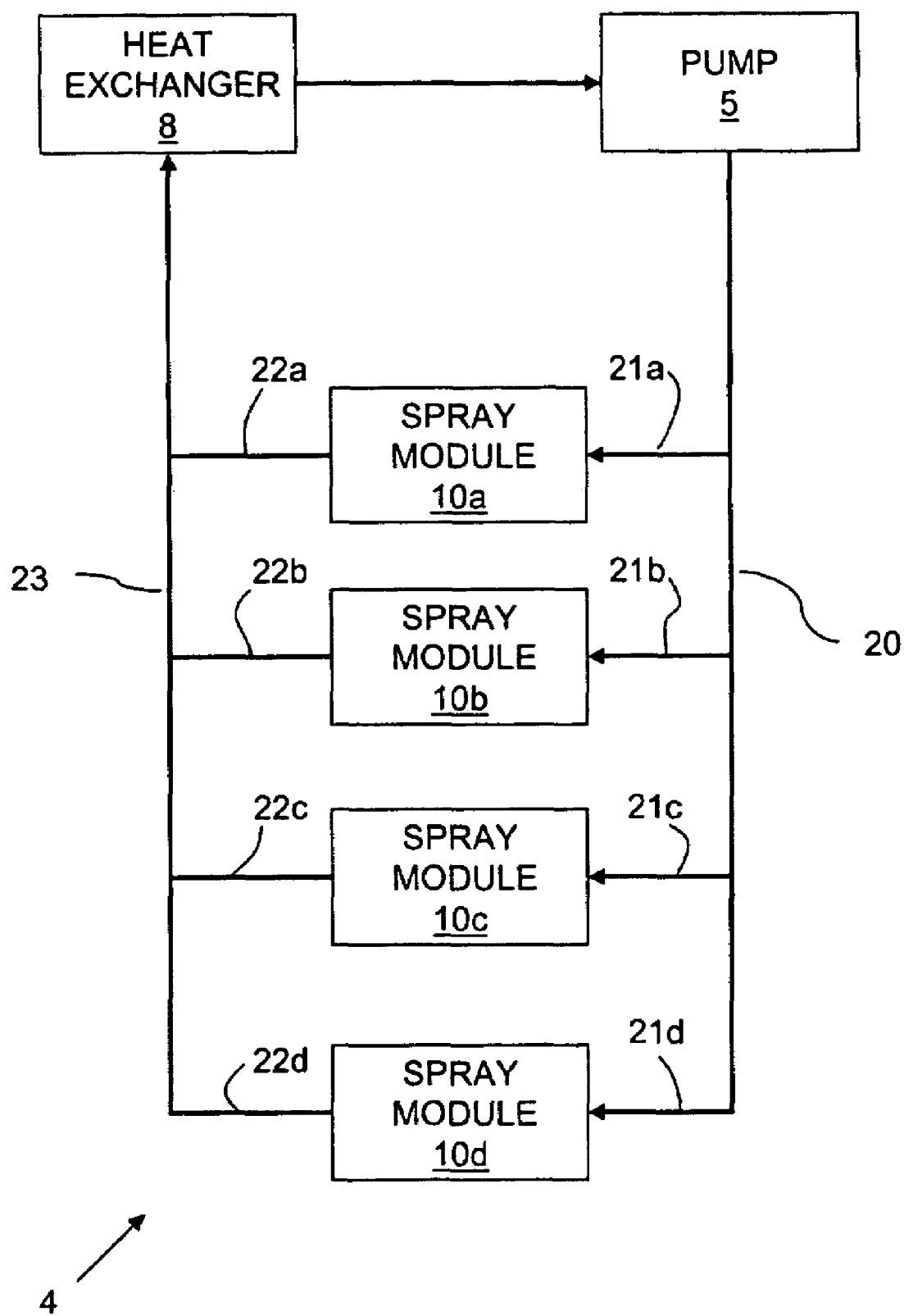
FIG. 1 is a block diagram of a two-phase thermal management system cooling with a plurality of spray cooling modules connected in parallel.

Now referring to FIG. 1, a two-phase thermal management system 4 is shown. A cooling fluid (not shown) is pressurized by a pump 5. An exemplary cooling pump 5 is described by U.S. Pat. No. 6,447,270. The cooling fluid may be any one of a wide range of commonly known dielectric or non-dielectric fluids, including but not limited to Fluorinert (a Trademark of 3M Company), hydrofluorether, and water mixtures. Cooling fluid travels from pump 5, through a supply manifold 20, and to a plurality of supply branches 21a, 21b, 21c and 21d. Fluid from supply branches 21a–21d delivers the pressurized cooling fluid to a plurality of spray modules 10a, 10b, 10c and 10d. The preferred method of constructing and using spray module 10a–10d is described by U.S. Pat. No. 5,220,804 incorporated by reference to this application.

The '804 patent describes a spray module capable of high heat flux thin film cooling. Fluid is deposited onto a heated surface in a fashion that promotes the creation of a thin coolant film. The coolant film absorbs energy by through evaporation. The overall heat transfer of the module is partly a function of the thickness of the coolant film and the pressures within the spray module. Although it is highly desirable, in terms of efficiency, to have all the liquid transform into vapor within the spray module, the exit fluid typically has a quality less than 100 percent.

Referring back to FIG. 1 and according to the present invention, the fluid leaving spray modules 10a–10d travels through a plurality of return branches 22a–22d, and into a return manifold 23. Return manifold 23 delivers two-phase fluid to a heat exchanger 8 wherein the two-phase cooling fluid returns to a pure liquid state prior to re-pressurization by pump 5.

Although four spray modules are shown in the accompanying drawings, the present invention is not limited to a certain number of spray modules within thermal system 4. In fact, in datacenter type applications, tens to hundreds of spray modules may be connected in parallel. For each spray module there will be a corresponding supply branch and return branch.

Figure 4:
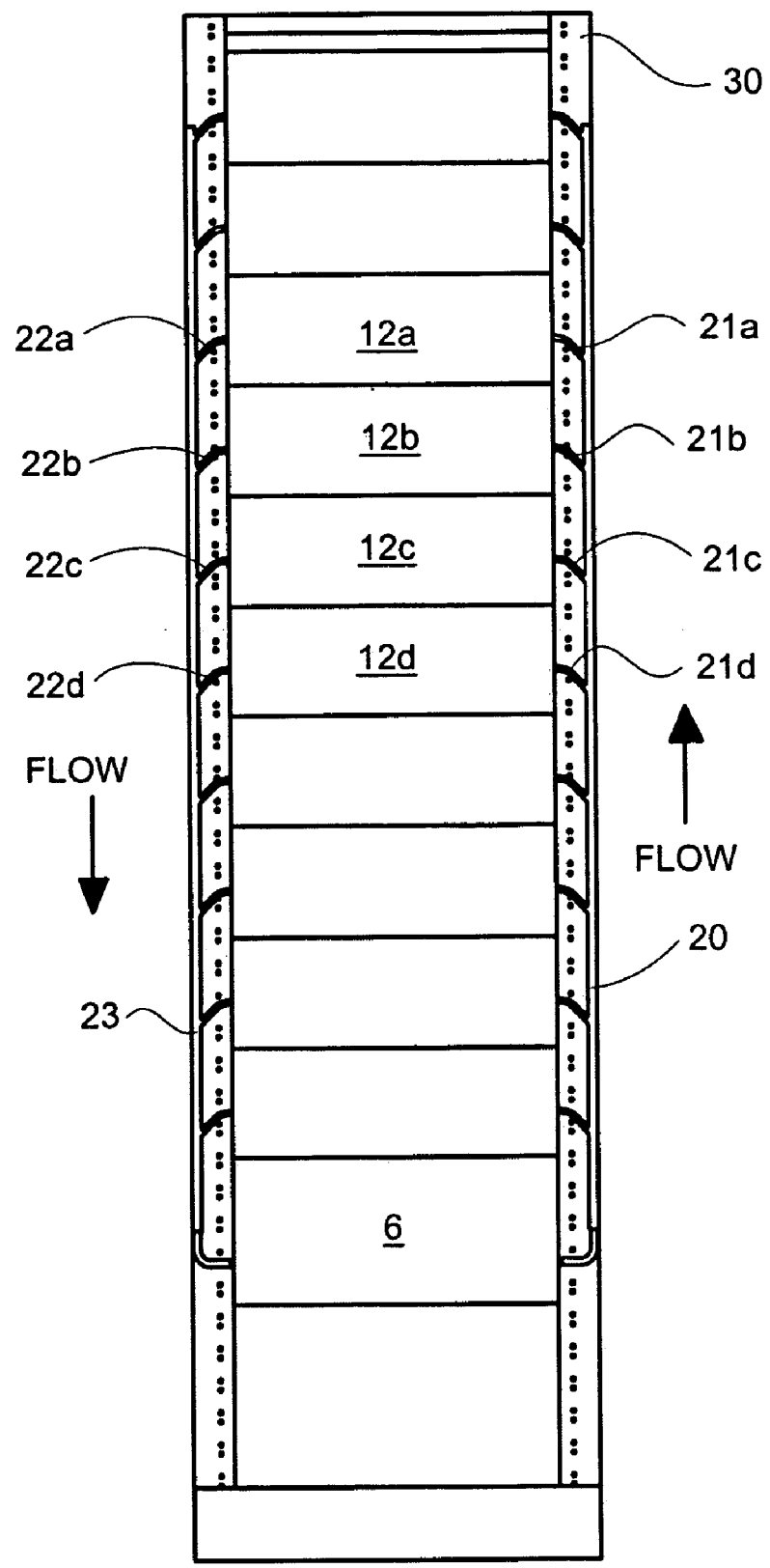
FIG. 4 is a front view of a rack containing multiple chassis that contain electronic components to be cooled by a two-phase thermal management system.

Thermal management system 4 is ideally suited for applications where numerous components to be cooled are located in a given space. For instance, FIG. 4 shows an equipment rack 30 commonly used in the networking or telecom industry. Chassis 12a–12d may be mounted to rack 30 which is secured to a floor. Chassis 12a–12d may be any number of available electronic enclosures including: routers, hubs, switches, power supplies, multiplexers, optical transmission equipment and the such. Each chassis 12a–12d may be of a different height, but will typically be of a standard specification driven height. For instance, chassis 12a may be four rack units in height, and chassis 12b may be only one rack unit in height. The ability to use a wide range of chassis types within rack 30 provides the ability to construct a wide range of applications specific computing configurations.

Figure 2:
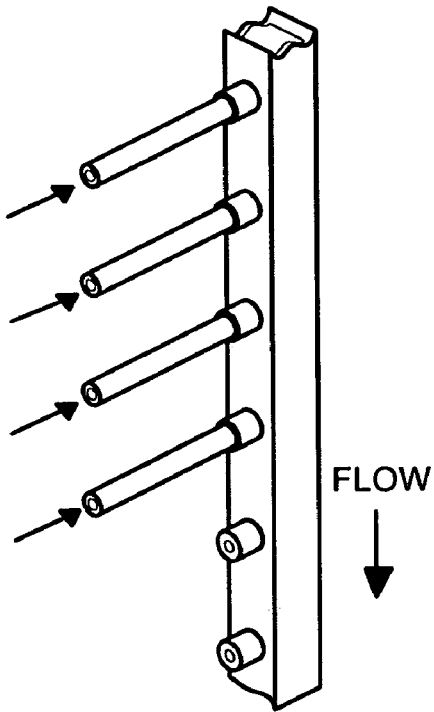
FIG. 2 is a perspective view of a prior art return manifold connected to a plurality of perpendicular return branches.

FIG. 4 is shown with thermal system unit 6 mounted below chassis 12d. Preferably, thermal management unit 6 contains pump 5, heat exchanger 8, and any number of common liquid cooling system components, such as monitoring equipment, sensors, reservoirs, filters and the like. Thermal management unit 6 delivers pressurized single phase coolant to supply manifold 20 and in the direction of chassis 12*d*. Along the length of supply manifold 20, a series of supply branches 21*a*–21*d* are fluidly connected with a spacing corresponding to rack units. Each supply branch 21*a*–21*d* provides fluid to a corresponding chassis 12*a*–12*d*. Unlike the prior art, braches 21*a*–21*d* are fluidly connected to supply manifold 20 at acute angles. Fluid entering supply branches 21*a*–21*d* has a vector component in the direction of fluid travel in supply manifold 20 and provides the means for minimizing pressure losses between pump 5 and spray modules 10*a*–10*d*. Wherein the branches of a prior system (FIG. 2) may have single phase resistance coefficients (K factors) of one to two, the acute angles between supply branches 21*a*–21*d* and supply manifold 20 provides individual resistances less than one.

Also located on rack 30 is return manifold 23. Similar to supply manifold 20, return manifold 23 is connected to return branches 22*a*–22*d* in a fashion that creates acute angles between them. Because the fluid flowing through braches 22*a*–22*d* and supply manifold 23 is two-phase, this acute angle provides significant system benefits. The fluid leaving return branches 22*a*–22*d* has a vector component in the direction of travel of fluid within return manifold 23 and provides the means for minimizing fluid momentum losses between spray modules 10*a*–10*d* and heat exchanger 8. The acute angle formed between return manifold 23 and return branches 22*a*–22*d* also provides the means for reducing backpressures on spray modules 10*a*–10*d*.

Figure 3:
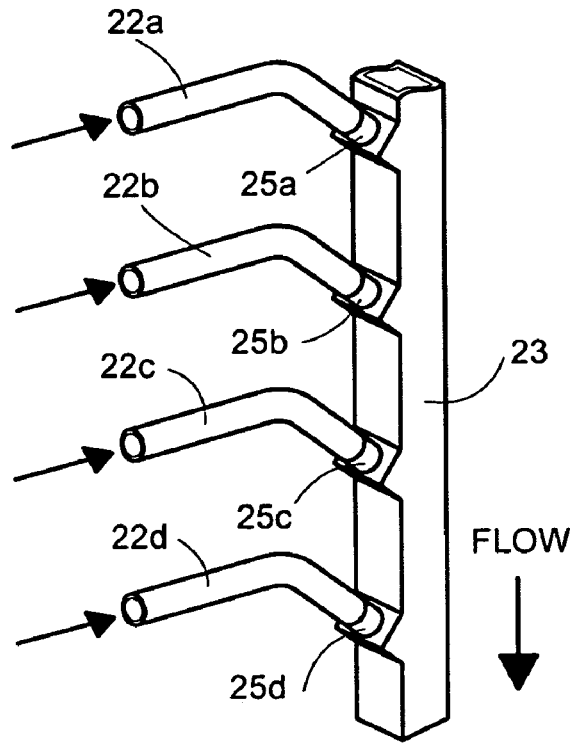
FIG. 3 is a perspective view of a return manifold with individual return branches feeding the return manifold at angles less than perpendicular and according to the present invention.

Return manifold 23 is shown in more detail in FIG. 3. Each individual return branch 21*a*, 21*b*, 21*c* and 21*d* is preferably connected to return manifold 23 through the use of a plurality of quick disconnect fittings 25*a*, 25*b*, 25*c* and 25*d*. Quick-disconnect fittings 25*a*–25*d* allow fluid to pass when a branch is inserted, but stops fluid from escaping once a branch is removed. Quick-disconnect fittings are widely available from companies such as Colder Products Company. Placing a series of valved fittings, such as quick-disconnect fittings 25*a*–25*d*, along the length of supply manifold 20 and return manifold 23 with spacing corresponding to rack units further creates the means for providing chassis configuration flexibility within rack 30. A wide range of chassis, of varying height, may be installed even after rack 30 is installed in the field. Supply manifold 20 and return manifold 23 may extend the entire length of rack 30, or just a portion if an application warrants. Supply manifold 20 and return manifold 23 may both be located on the same side of rack 30, separate sides (as shown in FIG. 4), and either in the front or back side of rack 30. It is also possible to have the vertical rails of rack 30 house return supply manifold 20 and return manifold 23.

Optimal construction of supply manifold 20, supply branches 21*a*–21*d*, return branches 22*a*–22*d* and return manifold 23 are application specific. For example, if space is limited in front of the rails of rack 30, it may be desirable to have a square shape to supply manifold 20 and return manifold 23. If supply manifold 20 and return manifold 23 are to be captured within the rails of rack 30, then a round cross section may be desirable. Optimal sizing is a function of the number of thermal management units in the system, the type of thermal management system, the type of fluid used, and the heat generated by the components. In some applications is may be desirable to size return manifold 23 sufficiently to promote gravity induced liquid-vapor separation within. It may also be desirable to size return manifold 23 sufficiently to separate any non-condensable gasses from the cooling fluid. A controllable valve 29 located at the highest point of return manifold 23 could provide the ability to vent unwanted non-condensable gases from the system.

ISR has verified the performance of the system using two 103 watt spray modules, a pump delivering roughly 20 p.s.i. of fluid pressure at 160 ml per minute, utilizing Fluorinert 5050 cooling fluid, and ¼ inch diameter polyurethane tubing for supply manifold 20, supply branches 21*a*–21*d*, return branches 22*a*–22*d*, and return branch 22. Although polyurethane tubing was used during testing, metallic materials are preferred for long term use with Fluorinert (a Trademark of 3M). Flexible polyurethane tubing is commercially available under the tradename Tygothane (a trademark of Norton Company Corp.)

Figure 5:
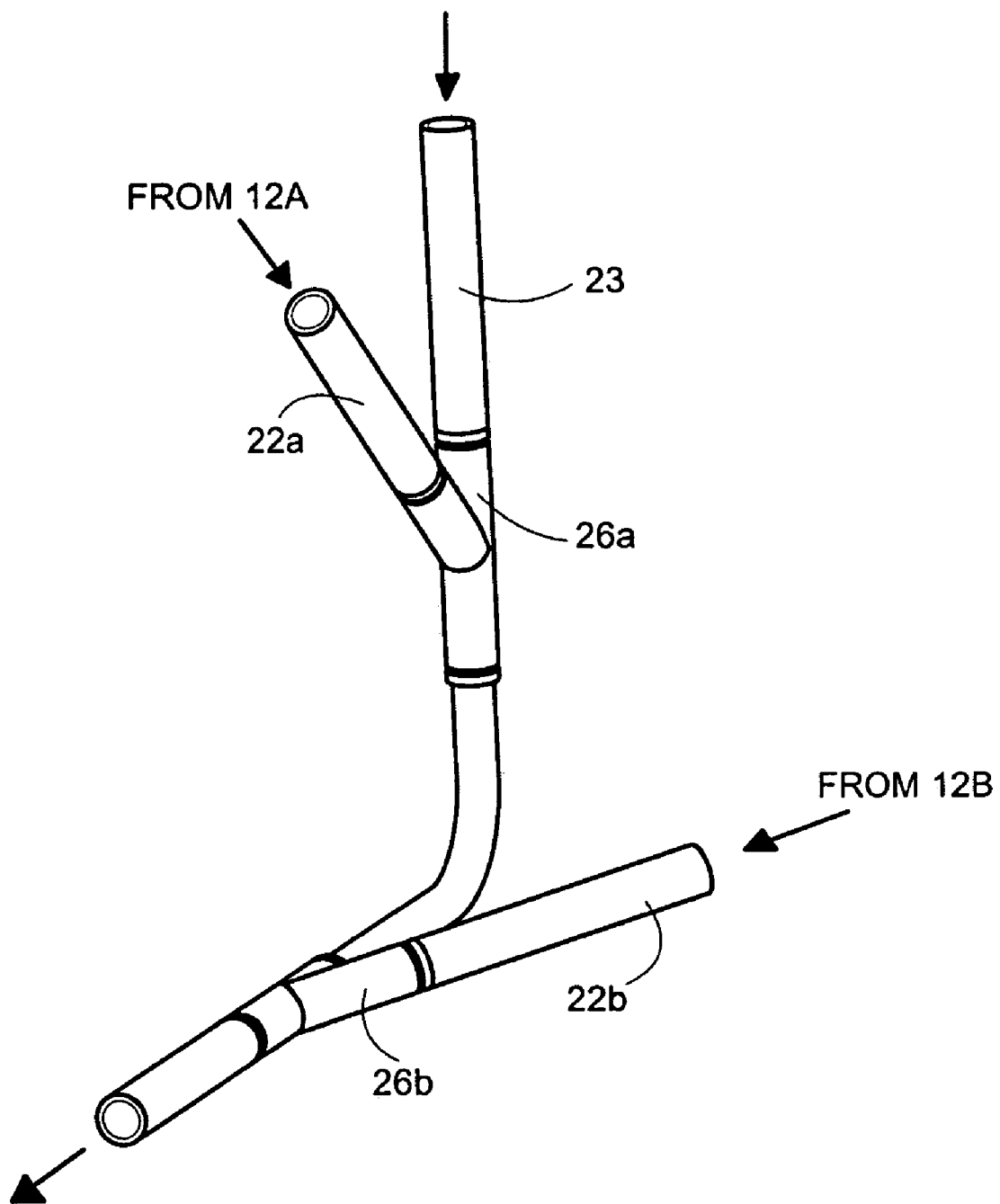
FIG. 5 is a partial perspective view of an alternative embodiment low momentum loss return line system, showing flexible tubing return branches connected at acute angles to a flexible return manifold, the connection between the branches and the manifold is created through the use of a plurality of splitter fittings.

FIG. 5, shows the alternative embodiment described above, wherein return manifold 23 is constructed from flexible tubing. A plurality of splitter fittings 26*a* and 26*b* are inserted into return manifold 23. Splitter fittings 26*a* and 26*b* are commercially available in 45 degree angles and can be manufactured in angles less than 45 degrees. Fittings 26*a* and 26*b* may also have integral quick-disconnect features. The flexible tubing embodiment shown in FIG. 5 provides the means for a low momentum loss manifold system capable of three dimensional shapes and configuration flexibility. The embodiment of FIG. 5, may be used to connect chassis 12*a*–12*d* to return manifold 23 (as shown), but can also be used to connect, in parallel, multiple spray modules within a single chassis. Thus, cooling fluid may be collected within an enclosure from multiple spray modules via a first plurality of return branches, which is fed into a secondary plurality of return branches, which in turn is fed into return manifold 23.

While the low momentum loss manifold system herein described constitutes preferred embodiments of the invention, it is to be understood that the invention is not limited to these precise form of assemblies, and that changes may be made therein with out departing from the scope and spirit of the invention. For example, return branches 22*a*–22*d* may be mounted perpendicular to return manifold 23, but contain an internal baffle that alters the trajectory of liquid and vapor coolant leaving return branches 22*a*–22*d* in the direction of flow within return manifold 23. For further example, it should be obvious to one skilled in the art that spray modules 10*a*–10*d* may be global spray cooling modules each integral to a chassis or enclosure.

We claim:

1. A method of removing a fluid from a plurality of thermal management modules in parallel within a closed loop liquid cooling system, said plurality of thermal management modules located within a plurality of chassis mounted to a rack, said plurality of chassis housing a plurality of heat generating electronic components, the method comprising:

using a plurality of return branches fluidly connected to said plurality of spray modules;

fluidly connecting said plurality of return branches at acute angles to a return manifold;

fluidly connecting said return manifold to a heat exchanger; and providing the means for flexibly configuring said plurality of chassis within said rack.

2. The method of claim 1, including connecting said plurality of return branches to said return manifold through the use of a plurality of quick disconnect fittings.

3. The method of claim 1, including making said plurality of return branches from a flexible material.

4. The method of claim 1, including making said return manifold from a flexible material.

5. A method of removing a fluid from a plurality of thermal management modules connected in parallel within a closed loop liquid cooling system, said plurality of thermal management modules located within a plurality of chassis mounted to a rack, said plurality of chassis housing a plurality of heat generating electronic components in thermal contact with said plurality of thermal management units, the method comprising:
- using a plurality of primary return branches fluidly connected to said plurality of thermal management modules;
- fluidly connecting said plurality of primary return branches to a plurality of secondary return branches, wherein said plurality of primary return branches join said plurality of secondary return branches at acute angles;
- fluidly connecting said plurality of secondary return branches to a return manifold;
- fluidly connecting said return manifold to a heat exchanger; and
- providing the means for flexibly configuring said plurality of chassis within said rack.

6. The method of claim 5, including connecting said plurality of secondary return branches to said return manifold through the use of a plurality of quick disconnect fittings.

7. The method of claim 5, including making said plurality of primary return branches from a flexible material.

8. The method of claim 5, including making said plurality of secondary return branches from a flexible material.

9. The method of claim 5, including making said return manifold from a flexible material.

10. A method of removing a fluid from a plurality of thermal management modules connected in parallel within a closed loop liquid cooling system, said plurality of thermal management modules located within a plurality of chassis mounted to a rack, said plurality of chassis housing a plurality of heat generating electronic components in thermal contact with said plurality of thermal management units, the method comprising:
- using a plurality of primary return branches fluidly connected to said plurality of thermal management modules;
- fluidly connecting said plurality of primary return branches to a plurality of secondary return branches, wherein said plurality of primary return branches join said plurality of secondary return branches at acute angles;
- fluidly connecting said plurality of secondary return branches to a return manifold, wherein said secondary return branches join said return manifold at acute angles;
- fluidly connecting said return manifold to a heat exchanger; and
- providing the means for flexibly configuring said plurality of chassis within said rack.

11. The method of claim 10, including connecting said plurality of secondary return branches to said return manifold through the use of a plurality of quick disconnect fittings.

12. The method of claim 10, including making said plurality of primary return branches from a flexible material.

13. The method of claim 10, including making said plurality of secondary return branches from a flexible material.

14. The method of claim 10, including making said return manifold from a flexible material.

15. A method of removing a fluid from a plurality of thermal management modules connected in parallel within a closed loop liquid cooling system, said plurality of thermal management modules located within a plurality of chassis mounted to a rack, said plurality of chassis housing a plurality of heat generating electronic components in thermal contact with said plurality of thermal management units, the method comprising:
- using a plurality of return branches fluidly connected to said plurality of thermal management modules, said plurality of return branches having a plurality of return branch flow vectors;
- fluidly connecting said plurality of return branches to a return manifold, said return manifold having a return manifold flow vector;
- wherein said plurality return branch flow vectors have a component in the direction of said return manifold flow vector;
- fluidly connecting said return manifold to a heat exchanger; and
- providing the means for flexibly configuring said plurality of chassis within said rack.

16. The method of claim 15, including connecting said plurality of secondary return branches to said return manifold through the use of a plurality of quick disconnect fittings.

17. The method of claim 15, including making said plurality of primary return branches from a flexible material.

18. The method of claim 15, including making said plurality of secondary return branches from a flexible material.

19. The method of claim 15, including making said return manifold from a flexible material.

20. A method of removing a fluid from a plurality of thermal management modules connected in parallel within a closed loop liquid cooling system, said-plurality of thermal management modules located within a plurality of chassis mounted to a rack, said plurality of chassis housing a plurality of heat generating electronic components in thermal contact with said plurality of thermal management units, the method comprising:
- using a plurality of primary return branches fluidly connected to said plurality of thermal management modules, said plurality of primary return branches having a plurality of primary return branch flow vectors;
- fluidly connecting said plurality of primary return branches to a plurality of secondary return branches, said plurality of secondary return branches having a plurality of secondary return branch flow vectors;
- wherein each of said plurality of primary return branch flow vectors have a component in the direction of said plurality of secondary return branch flow vectors;
- wherein said plurality of secondary return branches are fluidly connected to a return manifold having a return manifold flow vector;
- wherein each of said plurality of secondary return branch flow vectors have a component in the direction of said return manifold flow vector;
- fluidly connecting said return manifold to a heat exchanger; and
- providing the means for flexibly configuring said plurality of chassis within said rack.

21. The method of claim 20, including connecting said plurality of secondary return branches to said return manifold through the use of a plurality of quick disconnect fittings.

22. The method of claim 20, including making said plurality of primary return branches from a flexible material.

23. The method of claim 20, including making said plurality of secondary return branches from a flexible material.

24. The method of claim 20, including making said return manifold from a flexible material.

25. A liquid cooling system comprising:

a pump for pressurizing a supply of liquid coolant;

a supply system fluidly connected to said pump and for delivering said supply of liquid coolant to a plurality of thermal management modules contained within a plurality of electronic enclosures mounted to an equipment rack, said plurality of thermal management modules in thermal contact with a plurality of heat generating components within said plurality of electronic enclosures;

wherein said plurality of thermal management modules cool said plurality of heat generating components by transforming said supply of liquid coolant from a first energy state to a second energy state;

means for returning and minimizing fluid momentum losses of said supply of liquid coolant between said plurality of thermal management units and a heat exchanger;

wherein said heat exchanger transforms said supply of liquid coolant from said second energy state back to at least said first energy state; and means for providing configuration flexibility of said plurality of chassis within said rack.

26. The liquid cooling system of claim 25, wherein said supply system includes the means of minimizing pressure losses between said pump and said plurality of thermal management modules.

27. The liquid cooling system of claim 25, wherein said supply of liquid coolant is a dielectric fluid.

28. The liquid cooling system of claim 25, wherein said second energy state is a two-phase fluid.

* * * * *